United States Patent [19]

Gualandris

[11] Patent Number: 4,806,199

[45] Date of Patent: Feb. 21, 1989

[54] (RIE) PLASMA PROCESS FOR MAKING METAL-SEMICONDUCTOR OHMIC TYPE CONTACTS

[75] Inventor: Fabio Gualandris, Bergamo, Italy

[73] Assignee: SGS Microelettronica S.p.A., Catania, Italy

[21] Appl. No.: 907,342

[22] Filed: Sep. 15, 1986

[30] Foreign Application Priority Data

Oct. 14, 1985 [IT] Italy .................. 22468 A/85

[51] Int. Cl.[4] ............................. B44C 1/22
[52] U.S. Cl. ............................. 156/643; 156/651; 156/652; 156/653; 156/657; 156/662
[58] Field of Search ............ 156/662, 651, 652, 653, 156/657, 643

[56] References Cited

U.S. PATENT DOCUMENTS

| | | | |
|---|---|---|---|
| 4,268,374 | 5/1981 | Lepseltzer | 204/298 |
| 4,380,489 | 4/1983 | Beinvogl et al. | 156/643 |
| 4,412,119 | 10/1983 | Komatsu et al. | 219/121 |
| 4,528,066 | 7/1985 | Merkling, Jr. et al. | 156/646 |
| 4,534,826 | 8/1985 | Goth et al. | 156/643 |
| 4,582,581 | 4/1986 | Flanigan et al. | 156/643 |
| 4,599,243 | 7/1986 | Sachdev et al. | 156/643 |
| 4,631,248 | 12/1986 | Pasch | 156/643 |
| 4,687,543 | 8/1987 | Bowker | 156/643 |

*Primary Examiner*—Kenneth M. Schor
*Assistant Examiner*—Lori-Ann Johnson
*Attorney, Agent, or Firm*—Pollock, Vande Sande & Priddy

[57] ABSTRACT

An improved process of RIE plasma attack of the layer of dielectric material on the surface of wafers of semiconductor material, in correspondence of areas purposely defined by masking, for exposing the underlying semiconductor crystal, in preparation for depositing a layer of material of metallic conduction. After having removed a certain thickness of dielectric according to the known technique, the conditions of attack are modified, substituting the plasma gases and reducing the "bias". The attack is resumed of the residual layer of dielectric and preferably also of a certain thickness of the semiconductor crystal in the same reactor. Ohmic contacts with relatively low contact resistance and great reliability are obtained with a minimum handling of the wafers.

11 Claims, 1 Drawing Sheet

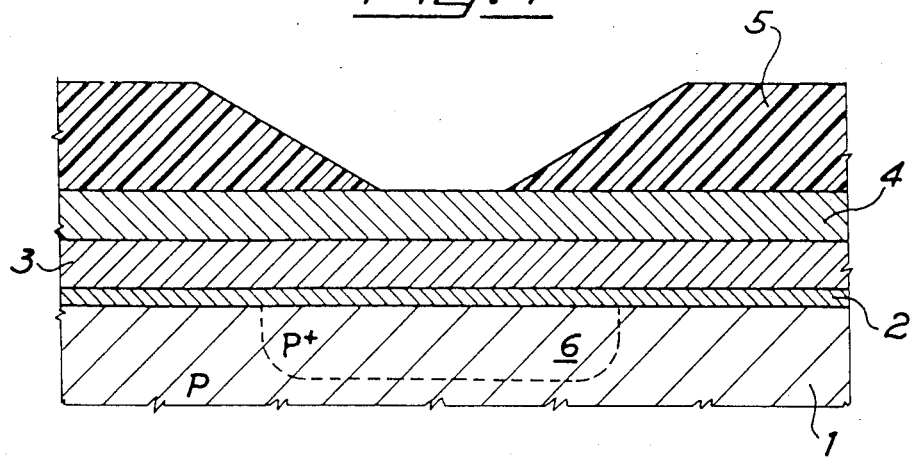
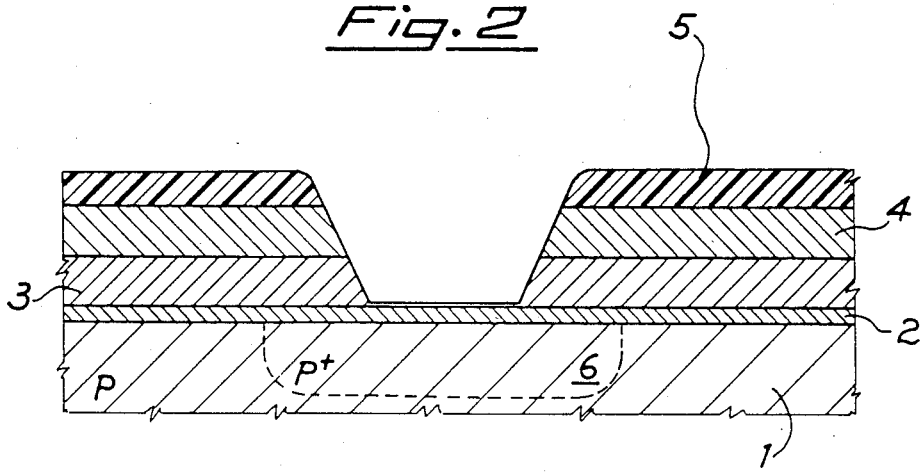
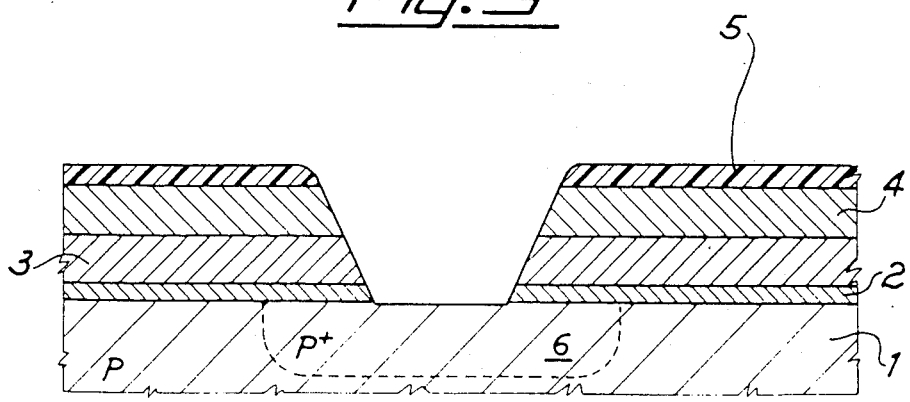

(RIE) PLASMA PROCESS FOR MAKING METAL-SEMICONDUCTOR OHMIC TYPE CONTACTS

The present invention concerns an improved process for making ohmic contacts between metal and semiconductor, in particular P or N doped silicon.

In fabricating any integrated circuit, as in the fabrication of any semiconductor device, according to the most different techniques used for making such devices, for example, by grown junction, by alloy junction, by planar technology, by planox fabrication technology (registered trade mark of SGS MICROELETTRONICA S.p.A.—Italy) etc., it is necessary to form ohmic type contacts between the semiconductor material, for example P or N doped silicon, and the metallic material. In other words, forming ohmic type contacts with the material having metallic conduction, utilized to form, for example, the necessary interconnections on the front side, or "front" of the integrated circuit.

The material having metallic conduction used may be of various kinds. Aluminum, tungsten, tantalum, titanium, their alloys, silicides and heavily doped polycrystalline silicon are examples of suitable materials used commercially.

This type of contact which is formed between the material of metallic conduction and the semiconductor material must show an essentially linear and symmetric about the origin current-voltage characteristic (ohmic contact), that is it, must not bring about current "rectification" phenomena or appreciable non-linearities at least within a certain portion (maximum foreseeable intensity of the current) about the origin of the axis at the working conditions (temperature, radiation, etc.) contemplated for the device.

Furthermore the contact resistance must be the lowest possible for obvious reasons of containing the power dissipation, for fast switching times in "EPROM" type devices, for good discrimination of the threshold levels in logic devices of the "GATE ARRAY" type, etc..

Commonly, according to the modern known technique, the process for making such contacts on wafers onto which have already been made the required diffusions thereafter having the superficial layer of oxide or of an equivalent isolation dielectric compound, reformed includes applying a new layer of photoresist and forming through it the appropriate "windows" by known photolithographic masking techniques. This technique contemplates that the removal of the layer of dielecxtric material, commonly oxide (e.g. $SiO_2$), in correspondence of the windows prefromed in the photoresist layer, until exposing the semiconductor (e.g. doped silicon), will take place under substantially anisotropic conditions, or any controlled conditions, in order that the dimensions of the areas onto which there will be established the ohmic contact be properly defined.

Therefore, it is a well established technique to carry out the removal of the oxide or of the similar dielectric material, in correspondence of the predefined windows, by means of a technique known as Reactive Ion Etching (RIE). That is, by means of a plasma attack of the oxide by reactive ions (radicals), typically $F^-$. The surface of the oxide being etched undergoes by part of ions accelerated by a radio frequency (RF) electric field applied between an electrode acting as the support of the wafers, and a counter-electrode, typically of larger dimensions. The electrodes are housed in a chamber or reactor which may be evacuated and which is provided with means for introducing and therein circulating a gas at controlled pressure, means for maintaining a constant temperature adjustable between 20° and 30° C., and means and instrumentations for controlling the attack process.

The desired anisotropy of the attack of the oxide being determined by the directionality of the bombardment by part of the ions which takes place, necessarily, perpendicular to the surface of the wafer through the opening of the window formed in the layer of photoresist. The process is conducted until exposing the underlying single crystal semiconductor.

Subsequent to such a process for preparation of the contact areas, the wafers are introduced in the apparatus for performing the metallization, which is commonly made by the technique known by the term "sputtering". According to such a technique, atoms of the selected metal or compound having metallic conduction obtained from a solid surface of the metal or of the compound itself bombarded by inert gas ions accelerated in an RF electric field, deposit generally over all the surfaces of the chamber and covering the wafers placed therein with a thin and extremely uniform layer.

It is also known to subsequently proceed to a heat treatment of the metallized wafers at a temperature, generally comprised between 300° and 500° C., and for a period of time sufficient to favor the formation of a metallurgical alloy between the deposited metal and the single crystal semiconductor material in correspondence of the areas of contact.

In contacts formed in this way, without further expedients, the contact resistance results are strongly influenced by the conditions of the surface of the semiconductor single crystal (e. g. silicon). The presence of residues of oxide after the attack for removing it from the areas intended for the formation of the contacts, and/or the successive re-oxidation of the surface of the semiconductor in coming into contact with the atmosphere to a thickness which may easily reach about 50 Å at room temperature conditions, the presence on the surface of the semiconductor of a film of polymeric material formed during the attack by $C_xF_y$ or possibly $C_xH_yF_z$ groups, and "implantation" of hydrogen atoms in the crystal structure of the semiconductor are some of the factors which cause a relatively high contact resistance.

Furthermore, it has been found that the contact resistance appears to be decisively influenced by the state of the crystal lattice of the semiconductor near the surface of contact with the metallization layer.

The step of removal of such a layer of dielectric is, as mentioned before, almost exclusively performed by methods which contemplate the bombardment with ions strongly accelerated in an RF electric field.

The crystal of semiconductor material, next to the surface, is noticeably damaged by this bombardment and such a damage may be detected by RBS (Rutherford Back Scattering) measurements. This damage due to the impingement of high energy ions may indeed bring about an accentuated modification of the semiconductor material which tends to be rendered amorphous, that is to lose its characteristics to single crystallinity, in proximity of the surface subjected to the bombardment. Such effects tend to increase noticeably the contact resistance. Furthermore, upon exposure to the atmosphere, on the surface of the semiconductor material thus exposed a thin layer of oxide is rapidly formed which may reach a thickness of about 50 Å; the oxidation itself may be strongly favored by the presence in the single crystal of semiconductor material of defects induced by the preceding RIE attack treatment.

With the aim of reducing contact resistance caused by the various phenomena of contamination of the exposed surface of the semiconductor material, it has been proposed to proceed with the removal of those impurities such as the eventual film of oxide due to the re-oxidation in air and/or of polymeric material, by subjecting the wafers to a brief sputter etch treatment through bombardment with non-reactive ions, commonly Argon ions ($Ar^+$), inside the chamber for the metal deposition itself, before proceeding to the deposition by sputtering of the metal.

This technique, though insuing an almost total absence of oxide or of other contaminants at the interface between the semiconductor and the metallization layer, introduces, on the other hand, a further bombardment damage of the crystal near the contact interface which adds to the damage caused by the preceding RIE attack determining conditions leading to a relatively high contact resistance.

More recently it has been proposed to perform, after the RIE attack of the layer of dielectric material until exposing the underlying semiconductor in $CHF_3+O_2$ plasma, a subsequent RIE attack in $NF_3+Ar$ plasma, that is using a non polymerizing reagent gas, of the exposed surface of the semiconductor material for removing the superficial portion of the single crystal to a depth of about 500 Å. Such a technique has the drawbacks of requiring the use of a particularly toxic gas and, though insuring the removal of the polymer and of the layer contaminated with implanted hydrogen atoms, does not overcome the problem represented by the other negative effects of the high energy ion bombardment of the semiconductor.

Another known technique is that of performing after the RIE attack, that is after the "opening of the contacts", a so-called "barrel" attack treatment, that is an attack in oxygen plasma performed by the known reactors having the shape of a barrel from which such a conventional name of this known type of plasma treatment derives, in order to remove the polymer and the residual photoresist material. After that, the wafers are again subjected to a plasma etch treatment (that is a substantially isotropic attack) in $CF_4+O_2$ plasma in order to remove a small thickness of the single crystal of semiconductor material in correspondence of the contact areas. The disadvantage of such a technique is the increased number of treatments and of the handling of the wafers as well as the possibility of polymeric substance remaining on the surface of the contacts.

A further disadvantage common more or less to all the methods of the prior art is represented by the fact that they require the removal of a substantial thickness of semiconductor material over the areas intended for the formation of the ohmic contact.

It is a principal object of the present invention to provide an improved process for making ohmic contacts of metal-semiconductor without the drawbacks of the known processes.

The process object of the present invention makes is possible to overcome the above mentioned disadvantages and drawbacks of the different kinds of the processes of the prior art in a surprisingly simple and effective way. Essentially the process of the present invention is characterized by the fact that the RIE attack for "opening" the areas of the contacts, that is for removing the layer of dielectric material in correspondence of the areas suitably defined on the surface by a layer of masking photoresist, is interrupted before exposing the underlying semiconductor material, thus effectively preventing any amorphousness or damage by bombardment of the crystal, the implantation of hydrogen, and other negative effects or contamination of the semiconductor during this first step of the process for making the aperture for the ohmic contacts.

Generally it is preferred to stop the RIE attack when a residual thickness of dielectric material of about 800–1500 Å still remains over the surface of the crystal of semiconductor material in correspondence of the areas intended for the realization of the contacts.

At this point, the conditions of attack are modified by substituting the plasma gas utilized during the first step of the attack, and which typically contain oxygen and carbon tetrafluoride ($CF_4$) or trifluoromethane ($CHF_3$) or any other compounds which may be easily polymerized under the conditions existing inside the reactor during the attack, with non polymerizable gaseous compounds such as for example sulphur hexafluoride ($SF_6$) and oxygen. Moreover, the "bias", that is the difference of potential between the plasma and the surface of the wafer or of the wafers, is reduced preferably in a way that it results in less than or equal to 350 V.

Under these modified conditions of attack the removal of the residual layer of dielectric material is completed and preferably a certain thickness of the underlying single crystal semiconductor material is also removed.

By this second step of RIE attack, conducted using plasma gas free of hydrogen and of polymerizing compounds, contamination of the surface of the semiconductor by polymer and by hydrogen is avoided. Moreover, by reducing drastically the bias conditions with respect to those normally used for the attack of the dielectric (first step), even though the semiconductor is exposed by the attack and eventually the attack is protracted in order to remove also a very thin superficial layer of the semiconductor, the semiconductor itself does not appear to undergo any noticeable damage.

The wafers thus prepared, are then treated in the usual manner, subjecting them to a barrel treatment to remove the residual photoresist and to an eventual acid wash to remove the eventual layer of re-oxidation and they are then metallized by sputtering.

The ohmic contacts formed in accordance with the improved process of the present invention show an outstandingly low resistance and a great reliability; these characters reflecting in a decisive reduction of production rejects.

Thus the process of the present invention provides for making ohmic contacts between a metallic conduction material and a single crystal semiconductor material (metal-semiconductor) of low contact resistance and high reliability without requiring additional handling of the wafers, by conducting the whole process of attack and of preparation of the surface of the cocntacts in a single reactor and utilizing attack gases of relatively low toxicity.

Further, due to the fact that during the first step of the attack of the major portion of the layer of dielectric any damage of the underlying semiconductor material is effectively prevented (that is of portion of the $P+$ or $N+$ diffused regions of the semiconductor forming the junctions of the device), it is no longer necessary, as it was instead in the known processes, to remove a substantial thickness of semiconductor material for insuring a complete removal of the portion strongly damaged by the preceding RIE attack of the dielectric. On the contrary removal of the doped semiconductor material may even be omitted or, preferably such a removal may be advantageously minimized in a way as not to exceed 100–150 Å in depth. In other words the removal of a minimum thickness (at least 50 Å) of semiconductor material is effected only for insuring the complete exposure of the crystal over the entire surface intended for the realization of the contact in consideration of eventual small disuniformities of advancement of the attack through the dielectric.

This is particularly advantageous, as it may easily be understood, in consideration of the evermore stringent dimensional limitations imposed by increasing the degree of miniaturization (integration).

With the aim of making easier the comprehension and the practice of the invention, the description proceeds now with the illustration of a particularly preferred embodiment thereof in the case of wafers of single crystal silicon with a layer of dielectric constituted substantially by silicon oxide and with direct reference to the annexed drawing wherein:

FIG. 1 is a schematic showing of a partial microsection in correspondence of a window defined by means of photolithographic techniques in a layer of photosensitive material purposely applied on the surface of a wafer;

FIG. 2 is a showing of the same microsection of FIG. 1 as it presents itself at the end of the first attack operation in RIE plasma;

FIG. 3 is a showing of the same microsection of the preceding figures as it presents itself at the end of the second operation of attack in modified RIE plasma according to the present invention.

As it is possible to observe in FIG. 1, the preparatory phase of the process for making the ohmic contacts in correspondence, for example, of a P+ diffusion region 6 in a silicon single crystal 1 covered by a layer of dielectric material constituted, for example, by a first layer 2 of thermally grown silicon oxide having a thickness of about 1500 Å onto which there is a layer 3 of silicon oxide deposited from vapor phase having a thickness of about 5000 Å and a layer 4 of silicon oxide doped with boron and phosphorus (BPSG for Boron Phosphorus Silicon Glass) also deposited thereon from vapor phase and having a thickness of about 5000 Å, consists in the operations of masking the surface by means of a layer of photosensitive resin (photoresist) 5 having a thickness of about 15,000 Å.

By means of the known photolithographic techniques suitable windows are defined in the layer of photoresist material in correspondence of the areas onto which it is desired to form the ohmic contact between the material having metallic conduction, for example aluminium or an alloy of aluminium and silicon with a silicon content comprised between 1 and 3% by weight which will be successively deposited on the surface of the wafer, and the silicon, for example the P+ silicon 6 of the particular junction shown in FIG. 1.

After eventual cleaning operations, several wafers are placed in suitable frames of the electrode of a reactor for plasma attacks (RIE) and the first step of attack is performed.

In the case of silicon wafers of the above mentioned characteristics it is preferred to perform the attack under the following working conditions:
pressure: about 50 milliTorr
plasma gas and relative fluxes:
  $CHF_3$ at 60 SCCM (standard centimeters cube per minute)
  $O_2$ at 40 SCCM
temperature: regulated and comprised between 20° and 25° C.
power transferred to the plasma: about 1350 W
bias: comprised between 500 and 600 V.

Under these conditions of attack is obtained a ratio of selectivity between the rate of attack of the silicon oxide and of the photoresist material of about 1:1, that is the rate of attack of the two materials is about the same.

Generally the volumetric ratio between $CHF_3$ and $O_2$ is preferably comprised between 2.5:2 and 3.5:2 during this first step.

This latter condition, together with the particular profile of the window preformed in the layer of photoresist, produces a desirable tapered cross section of the cavity produced in the layer of dielectric constitued by the distinct layers 4 and 3 of silicon oxide.

Generally, under these conditions, the rate of attack of the silicon oxide is about 500 Å/min.

The attack is protracted until reaching a depth so as to correspond more or less with the beginning of the oxide layer 2 (thermally grown oxide) present on the surface of the silicon, that is leaving a residual thickness of oxide of about 1000 Å.

Generally this first step of attack has a duration comprised between 15 and 25 minutes.

The profile of the etched cavity obtained is shown schematically in FIG. 2.

At this point power is cut off, the atmosphere of the reaction chamber is purged and the conditions for the second operation of attack contemplated by the process of the invention are predisposed and may be indicated as follows:
pressure: about 50 milliTorr
plasma gas and relative fluxes:
  $SF_6$ at 25 SCCM
  $O_2$ at 3 SCCM
temperature: regulated and comprised between 20° and 25° C.
power transferred to the plasma: about 1350 W
bias: comprised between 300 and 400 V.

Under these conditions the rate of attack of silicon oxide results about 300–350 Å/min, while the eventually exposed silicon is attacked at a rate of about 600–800 Å/min.

Generally the duration of this second step of attack is about 1.5–2.0 minutes.

The profile of the cross section of the "apertures" thus obtained is that indicated in FIG. 3.

In general the volumetric ratio between $SF_6$ and $O_2$ may range between 10:1 and 2:1 and may be adjusted in function of the relative thicknesses of the photoresist and of the oxide layer(s) in order to obtain the desired rates of attack.

What I claim is:

1. A process for exposing semiconductor material for the deposition thereon of a layer of a material showing metallic conduction for providing for ohmic type metal-semiconductor contacts which comprises a RIE plasma attack treatment for the formation of apertures in a layer of dielectric material covering the surface of a single crystal semiconductor material, corresponding to areas defined on the surface of said layer of a dielectric by masking, for exposing said underlying single crystal semiconductor material corresponding to said areas in preparation for depositing on said wafer a layer of a material showing metallic conduction for establishing metal-semiconductor contacts corresponding to said areas, wherein
  (a) said RIE plasma attack utilizes a plasma in a reaction zone containing at least a polymerizable compound containing fluorine and oxygen, and is carried out on the layer of dielectric material until a depth short of exposing the underlying single crystal semiconductor material is achieved and then said RIE plasma attack is interrupted;
  (b) purging the plasma gases of the preceding RIE plasma attack step in said reaction zone and introducing to said reaction zone a gas mixture of a non-polymerizable, hydrogen-free compound containing fluorine and oxygen while maintaining the atmosphere in said reaction zone free of hydrogen and free of polymerizing compounds;
  (c) resuming and continuing to complete the RIE plasma attack of the residual layer of dielectric material to thereby expose the single crystal semiconductor material.

2. The process of claim 1 wherein the layer of dielectric material is composed of silicon dioxide and the single crystal semiconductor material is P or N doped silicon.

3. The process of claim 1 wherein said non-polymerizable compound containing flourine is sulphur hexafluoride.

4. The process of claim 3 wherein the first step (a) of RIE attack is conducted with a bias greater or equal to 500 V and with a plasma gas composed of a mixture of trifluoromethane and oxygen in a volumetric ratio comprised between 2.5:2 and 3.5:2.

5. The process of claim 3 wherein the final step of attack (c) is conducted with a bias less or equal to 350 V.

6. The process of claim 3 wherein the step of final attack (c) is protracted until removing a thickness of semiconductor material greater or equal to at least 50 Å.

7. The process of claim 6 wherein the step of final attack (c) is protracted until removing a thickness of semiconductor material of no more than 150 Å.

8. The process of claim 4 wherein said bias is 500 V to 600 V.

9. The process of claim 3 wherein the RIE attack (a) leaves about 800 Å to 1500 Å of dielectric material remaining over the semiconductor material.

10. The process of claim 3 wherein volumetric ratio between $SF_6$ and oxygen is between 10:1 and 2:1.

11. The process of claim 3 wherein the final step of attack (c) is conducted with a bias of 300 V to 400 V.

* * * * *